United States Patent
Squibb

(10) Patent No.: US 7,211,977 B2
(45) Date of Patent: May 1, 2007

(54) PULSE WIDTH MODULATION FAN CONTROL

(75) Inventor: George Farris Squibb, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 162 days.

(21) Appl. No.: 10/890,308

(22) Filed: Jul. 13, 2004

(65) Prior Publication Data

US 2006/0013571 A1 Jan. 19, 2006

(51) Int. Cl.
*H02P 3/00* (2006.01)

(52) U.S. Cl. .................. 318/471; 318/254; 318/599; 713/300; 700/300

(58) Field of Classification Search .......... 388/934; 318/804, 811, 819, 829, 831, 599, 618, 641, 318/471, 254; 417/22; 700/300; 713/300
See application file for complete search history.

(56) References Cited

U.S. PATENT DOCUMENTS

| | | | | |
|---|---|---|---|---|
| 4,441,068 A * | 4/1984 | Smith | .......... | 323/351 |
| 4,599,548 A * | 7/1986 | Schultz | .......... | 318/599 |
| 5,760,563 A * | 6/1998 | Bennett et al. | .......... | 318/641 |
| 6,037,732 A * | 3/2000 | Alfano et al. | .......... | 318/471 |
| 6,040,668 A * | 3/2000 | Huynh et al. | .......... | 318/471 |
| 6,135,718 A * | 10/2000 | Yang | .......... | 417/22 |
| 6,349,385 B1 * | 2/2002 | Kaminski et al. | .......... | 713/300 |
| 6,390,379 B1 * | 5/2002 | Huang | .......... | 236/49.3 |
| 6,601,167 B1 * | 7/2003 | Gibson et al. | .......... | 713/2 |
| 6,650,074 B1 * | 11/2003 | Vyssotski et al. | .......... | 318/254 |
| 6,654,894 B2 * | 11/2003 | Kaminski et al. | .......... | 713/300 |
| 6,700,339 B2 * | 3/2004 | Vyssotski et al. | .......... | 318/254 |
| 6,815,916 B2 * | 11/2004 | Horng et al. | .......... | 318/138 |
| 6,873,883 B2 * | 3/2005 | Ziarnik | .......... | 700/300 |
| 6,874,327 B1 * | 4/2005 | Wahler et al. | .......... | 62/178 |
| 6,891,347 B2 * | 5/2005 | Dobbs et al. | .......... | 318/471 |
| 6,919,703 B2 * | 7/2005 | Marando et al. | .......... | 318/599 |
| 6,933,697 B2 * | 8/2005 | Marando et al. | .......... | 318/599 |
| 6,943,517 B2 * | 9/2005 | Yoshitomi et al. | .......... | 318/471 |
| 6,956,344 B2 * | 10/2005 | Robertson et al. | .......... | 318/538 |
| 7,029,239 B2 * | 4/2006 | Marando et al. | .......... | 417/32 |
| 2002/0059533 A1 * | 5/2002 | Kaminski et al. | .......... | 713/300 |
| 2003/0120394 A1 * | 6/2003 | Ziarnik | .......... | 700/300 |
| 2003/0222608 A1 * | 12/2003 | Vyssotski et al. | .......... | 318/254 |
| 2004/0257024 A1 * | 12/2004 | Marando et al. | .......... | 318/647 |

OTHER PUBLICATIONS

Pulse-Width-Modulation Control Circuit, Apr. 1988 revised Aug. 2001, Texas INstruments, SLVS052E, pp. 1-9.*

* cited by examiner

*Primary Examiner*—Paul Ip

(57) ABSTRACT

In one embodiment, a fan control system includes a temperature-sensing device that is adapted to sense a temperature of a component and output a temperature feedback signal, and a pulse width modulation control circuit that is configured to receive the temperature feedback signal output from the temperature-sensing device and a separate fan command signal and, relative to those signals, generate a pulse width modulation signal that is sent to a pulse width modulation controlled fan.

38 Claims, 4 Drawing Sheets

PULSE WIDTH MODULATION FAN CONTROL

BACKGROUND

Various components used in computers generate heat that must be dissipated in order for the components to function properly. The heat generated by such computer components is typically dissipated using fans that draw or force ambient air across or through the components. In order to reduce power consumption and noise generation, the speeds of such fans are regulated relative to the needs of the computer in which the fans are provided. For example, the speed of a given fan may be controlled in relation to the temperature of a component that the fan is provided to cool. In some cases, federal regulations require that a given component not exceed a specified operating temperature.

Some cooling fans used within computers are microprocessor controlled. Although microprocessor control provides an advantage in terms of the precision with which the fan speed can be regulated, microprocessor control is not appropriate for every application. For instance, microprocessors may be inappropriate for cooling power supplies due to the relatively high cost of such microprocessors. Accordingly, alternative means have been used in the prior art to control computer fans.

In one solution, a power-dissipating device, such as a PNP transistor, is connected in series with the fan such that the amount of voltage that is delivered to the fan is reduced by the amount of voltage that is provided to the dissipating device. Although such a solution is viable, it is undesirable from a power consumption standpoint. Specifically, that solution is wasteful in that the same power is required to drive the fan irrespective of the speed at which the fan operates. A further disadvantage of that solution is that the range of fan operating speeds under such a control scheme is limited, as are the number of different speeds that the fan can be operated within that range.

SUMMARY

In one embodiment, a fan control system includes a temperature-sensing device that is adapted to sense a temperature of a component and output a temperature feedback signal, and a pulse width modulation control circuit that is configured to receive the temperature feedback signal output from the temperature-sensing device and a separate fan command signal and, relative to those signals, generate a pulse width modulation signal that is sent to a pulse width modulation controlled fan.

In one embodiment, a method for controlling a fan includes receiving a temperature feedback signal from a temperature-sensing device associated with a computer component, receiving a fan command signal, comparing the temperature feedback signal and the fan command signal to determine which requires a larger duty cycle, and generating a pulse width modulation signal having a duty cycle that is generated relative to the signal that requires a larger duty cycle.

BRIEF DESCRIPTION OF THE DRAWINGS

The disclosed fan control systems and methods can be better understood with reference to the following drawings. The components in the drawings are not necessarily to scale.

DETAILED DESCRIPTION

As is identified above, microprocessor control of cooling fans is undesirable for certain computer applications. For instance, microprocessor control may not be desirable for cooling computer power supplies due to the relatively high cost of the microprocessor that provides that control. Although there are existing alternative solutions, such as use of a power-dissipation device that reduces the amount of voltage that is provided to the fan, such solutions may also be undesirable, given that they waste power and do not provide a broad range of high-precision speed control. As is described in the following, however, precise fan control over a wide range of speeds can be provided at a relatively low cost using a pulse width modulation (PWM) controlled fan.

In one embodiment, a control circuit is used to produce a PWM signal that is provided to the PWM controlled fan. The control circuit generates the PWM signal relative to multiple inputs that it receives from components within the computer in which the fan resides. More particularly, the control circuit receives a feedback signal from a temperature-sensing device associated with the component to be cooled, and a command signal from the computer system (e.g., the system motherboard).

The control circuit controls the fan speed in relation to the feedback signal so that the fan speed is at least fast enough to maintain the temperature of the component below a predetermined maximum. However, the control circuit is further configured such that the system command signal can override the feedback signal to increase the speed of the fan. Accordingly, the fan speed is maintained at a level that, at minimum, provides a required amount of cooling for the component, and further can be increased when required by the command signal, for example, to increase the net flow of air through the computer enclosure for additional cooling of the system.

Figure 1:
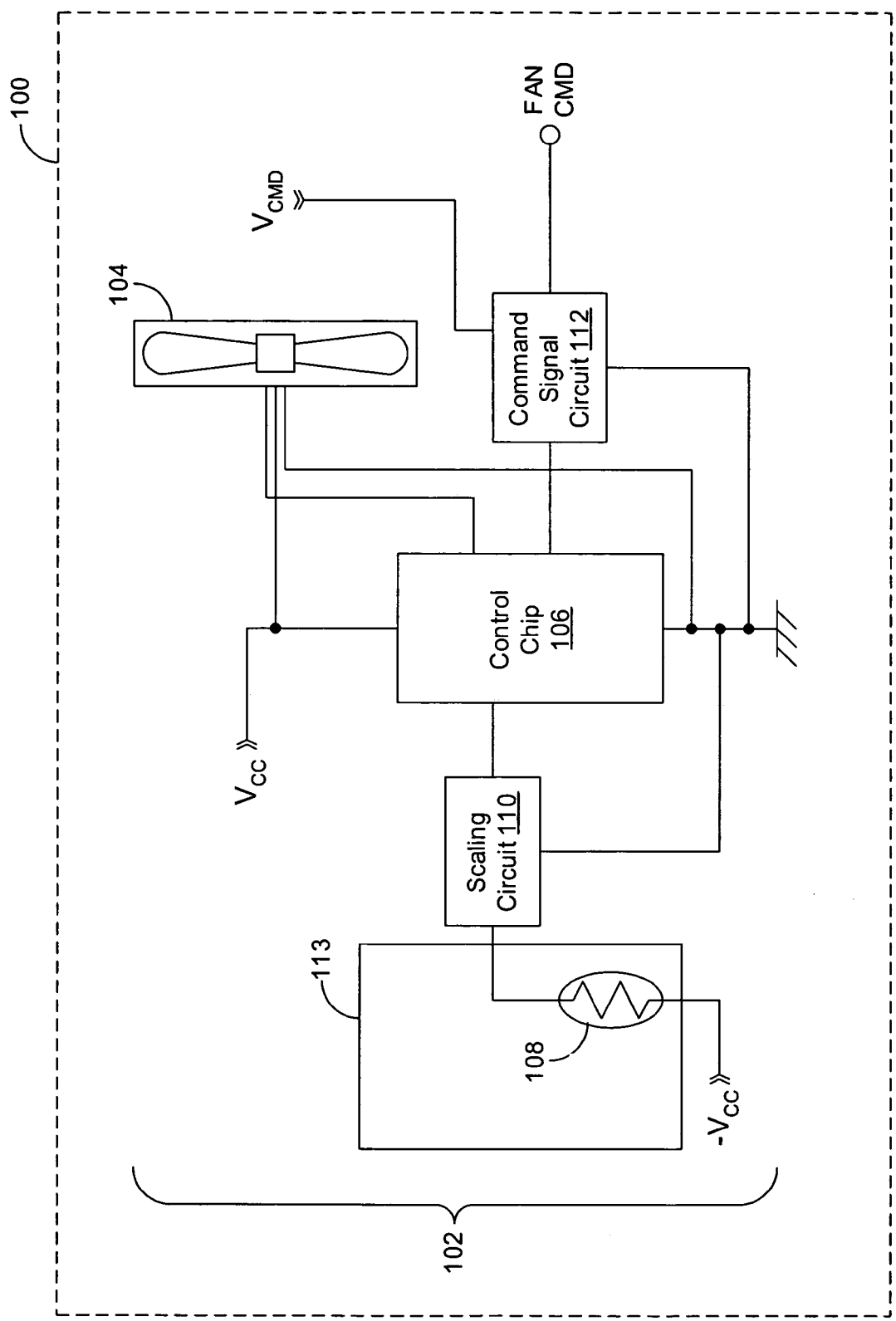
FIG. 1 is block diagram of an embodiment of a computer that includes a fan control system.

Referring now to the figures, in which like numerals designate corresponding parts, FIG. 1 provides a block diagram of a computer 100 that comprises a control system 102 that is used to control the speed of a fan 104 that is provided within the computer. The fan 104 is specifically provided to cool a particular component of the computer 100. By way of example, the component to be cooled comprises a power supply (not shown) of the computer 100. The fan 104 is a PWM controlled fan that comprises its own integrated circuit that controls the fan speed relative to a PWM input signal provided by the control system 102. By way of example, the fan 104 comprises a model 3110RL-04W-S86 from the Mineba Matsushita Motor Company.

The control system 102 comprises various components including a control circuit or chip 106, a temperature-sensing device 108, a scaling circuit 110, and a command signal circuit 112. The control chip 106 is configured to receive multiple DC voltage inputs, and output a PWM signal to the fan 104. More specifically, the control chip 106 is configured to receive a DC feedback signal formed from a signal output by the temperature-sensing device 108 that establishes a minimum operating speed for the fan 104, and a DC fan command signal (FAN CMD) from the computer system (e.g., system motherboard) that can override the feedback signal to increase the fan speed. An example configuration for the control chip 106 is described below in relation to FIGS. 2 and 3.

The temperature-sensing device 108 is typically provided on or within the component 113 that is cooled by the fan 104. Accordingly, when the component 113 comprises a power supply, the temperature-sensing device 108 is mounted on or within the power supply heatsink. The temperature-sensing device 108 comprises any device that can sense the temperature of the component to be cooled and output a signal to the control chip 106. In one embodiment, the temperature-sensing device 108 comprises a thermistor. One suitable thermistor comprises the model TSC03103JDA03160 thermistor from Thinking Electronics.

The scaling circuit 110 is provided to scale the voltage signal output by the temperature-sensing device 108. In similar manner, the command signal circuit 112 is provided to modify the fan command signal. Example configurations for those circuits 110, 112 are described below in relation to FIG. 2. Notably, either or both of the scaling circuit 110 and the command signal circuit 112 may be omitted depending upon the particular system configuration or application.

During fan operation, a supply voltage $V_{CC}$ is provided to the temperature-sensing device 108, the control chip 106, and the fan 104, and a command signal voltage $V_{CMD}$ is provided to the command signal circuit 112.

Figure 2:
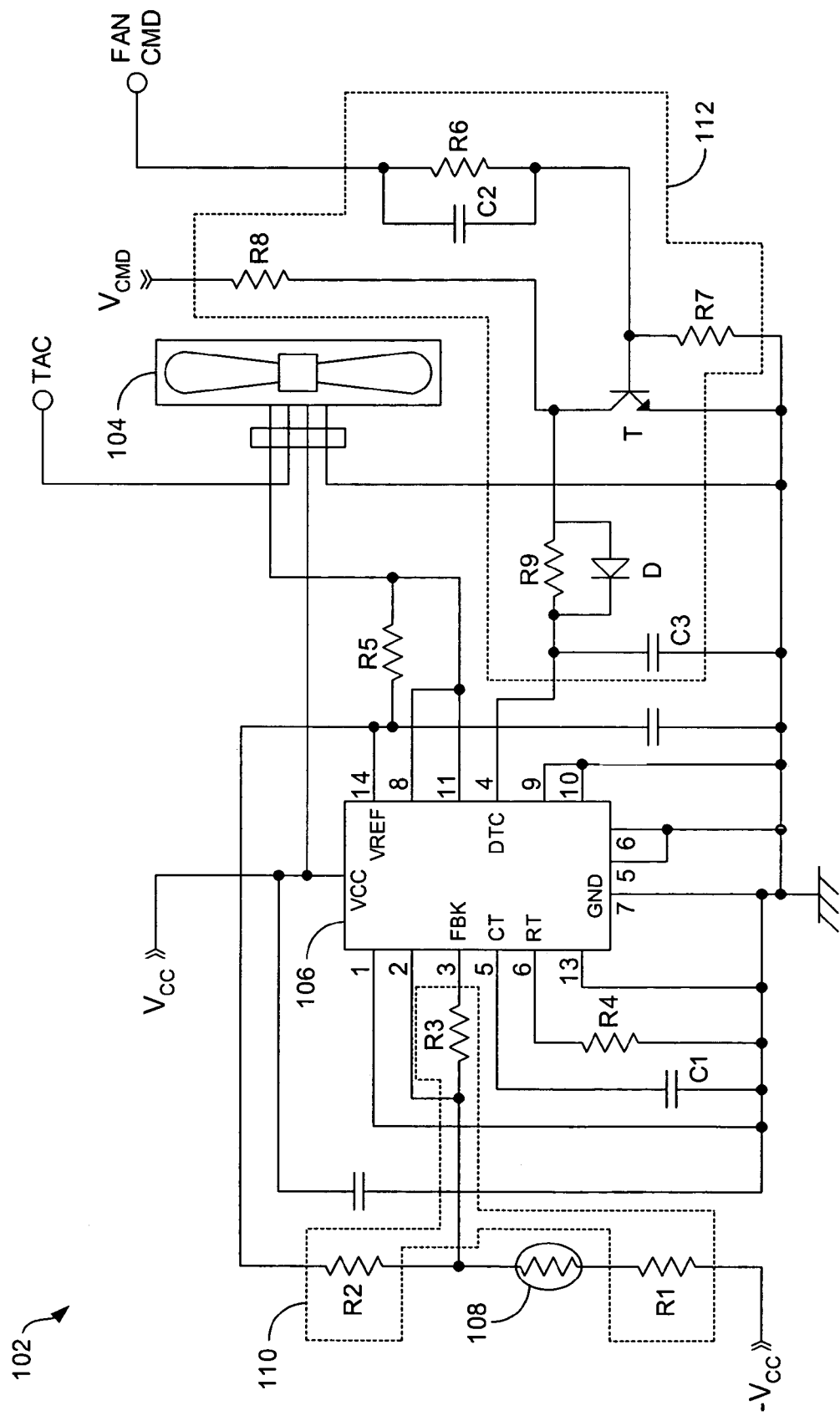
FIG. 2 is a block diagram of an example embodiment of the fan control system shown in FIG. 1.

Referring now to FIG. 2, illustrated is an example embodiment for the control system 102 shown in FIG. 1. It is noted that the circuit implementation described in the following is but an example of many circuits that can perform the same or similar functions discussed herein. Therefore, the following circuit implementation is intended as an exemplary embodiment and is not intended to limit the scope of this disclosure.

As is depicted in FIG. 2, the scaling circuit 110 includes resistors R1, R2, and R3. Those resistors R1-R3 together form a voltage divider that scales the voltage output from the temperature-sensing device 108. By way of example, the resistors have the following resistances: R1=9.76 kilo ohms (kΩ), R2=28.7 kΩ, and R3=3.92 kΩ. As the temperature of the component to be cooled is sensed, the temperature-sensing device 108 outputs a signal that is scaled by the scaling circuit 110 and input into pin 2 of the control chip 106.

Figure 3:
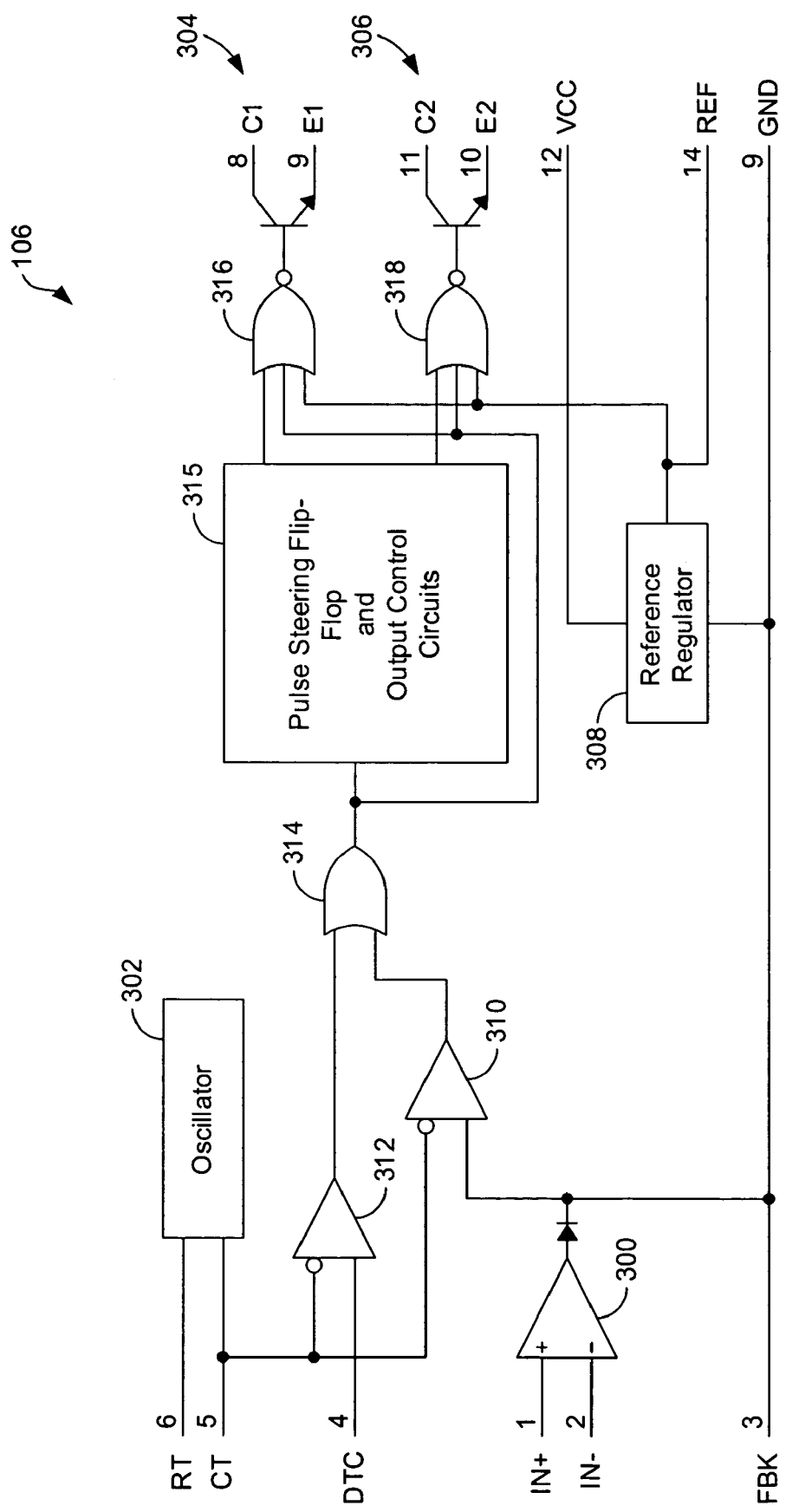
FIG. 3 is a functional block diagram of a control chip shown in FIG. 2.

In one embodiment, the control chip 106 comprises a TL594 chip available from Texas Instruments. From this point forward, the control chip 106 is assumed to comprise the TL594 chip. The configuration and operation of that chip is described in specification SLVS052F entitled "Pulse-Width-Modulation Control Circuit," November 2003 revision, which is hereby incorporated by reference into this disclosure. A simplified functional block diagram of that control circuit is provided in FIG. 3. As is shown in FIG. 3, the control chip 106 comprises a operational amplifier 300 having inputs connected to pins 1 and 2 and an output that is connected to pin 3.

In the example embodiment, the input signal is received at pin 2, amplified by amplifier, and output to pin 3. The amplified signal or, feedback signal, is then compared within the control chip 106 with a ramp signal to establish a minimum duty cycle for the fan 104. The comparison process is described in greater detail below. The ramp signal is generated by an oscillator 302 with inputs connected to pins 5 and 6, which are connected to a capacitor C1 and a resistor R4, respectively. The capacitor C1 and resistor R4 are selected so as to set the clock speed for the control chip 106 to a desired frequency. By way of example, the capacitor C1 has a capacitance of 0.01 microFarads (μF) and the resistor R4 has a resistance of 6.04 kΩ.

Through the performed comparison, an appropriate PWM signal may be generated and output from pins 8 and 11 of the control chip. As is depicted in FIG. 3, pins 8 and 11 are connected to the collectors of two transistors 304 and 306, respectively, which have emitters connected to pins 9 and 10 (connected to ground). With reference back to FIG. 2, the output PWM signal is increased in magnitude with a pull-up resistor R5 that is tied to pin 14 of the control chip 106 to which a reference voltage $V_{REF}$ is applied. By way of example, the pull-up resistor R4 has a resistance of 10 kΩ and the reference voltage $V_{REF}$ is set by a reference regulator 308 (FIG. 3) to 5 volts (V).

As is noted above, the feedback signal of the temperature-sensing device 108 can be overridden by the fan command signal (FAN CMD) that is generated by the computer system. The fan command signal is a PWM signal that ranges from 0 V to the VCMD voltage, for instance 3.3 V. The fan command signal is input into the command signal circuit 112. In the embodiment of FIG. 2, the command signal circuit 112 comprises an input network that includes a capacitor C2, a resistor R6, and a further resistor R7 that invert the fan command signal prior to the signal being input into a transistor T so as to control the transistor to produce a signal having approximately the same duty cycle of the fan command signal. By way of example, the capacitor C2 has a capacitance of 27 pico Farads (pF), the resistor R6 has a esistance of 68 kΩ, and the resistor R7 has a resistance of 27 kΩ.

In response to the fan command signal, the transistor T alternately opens and closes to charge and discharge a capacitor C3. More specifically, when the transistor T switches off, $V_{CMD}$ is applied across resistor R8 (e.g., 100 kΩ) and through diode D to charge the capacitor C3 and, when the transistor switches on, the capacitor C3 discharges its stored voltage to ground through resistor R9 (e.g., 100 kΩ). Operating in this manner, the PWM fan command signal is converted into a proportional DC signal that is input into pin 4 of the control chip 106.

Referring again to FIG. 3, the feedback signal input into pin 3 and the converted fan command signal input into pin 4 are compared with the ramp signal (i.e., a saw tooth wave) that is generated by the control chip using the oscillator 302 and the signals input through pins 5 and 6. Specifically, the inverse of the ramp signal and the feedback signal are compared in a first comparator 310, and the inverse of the ramp signal and the converted fan command signal are compared in a second comparator 312. The outputs of those comparators 310, 312 are then input into an OR gate 314 that outputs the input signal having the larger duty cycle. In the embodiment of FIG. 3, that signal is output to the transistors 304 and 306 after passing through pulse steering flip-flop and output control circuits 315 (see chip specification) and NAND gates 316 and 318. As a result, a PWM control signal is output from the transistors 304, 306 through pins 8 and 11 that is used by the fan's integrated circuit to control the fan 104 to operate at least as fast as required by the feedback signal, but possibly faster if the magnitude of the duty cycle corresponding to the fan command signal is larger than that corresponding to the feedback signal.

With such control, the fan 104 is operated to at least adequately cool the component with which the fan is associated (e.g., power supply) and, optionally, to run faster to increase the net airflow within the computer enclosure. The fan speed can be monitored during operation using a tachometer signal (TAC) output from the fan 104.

Figure 4:
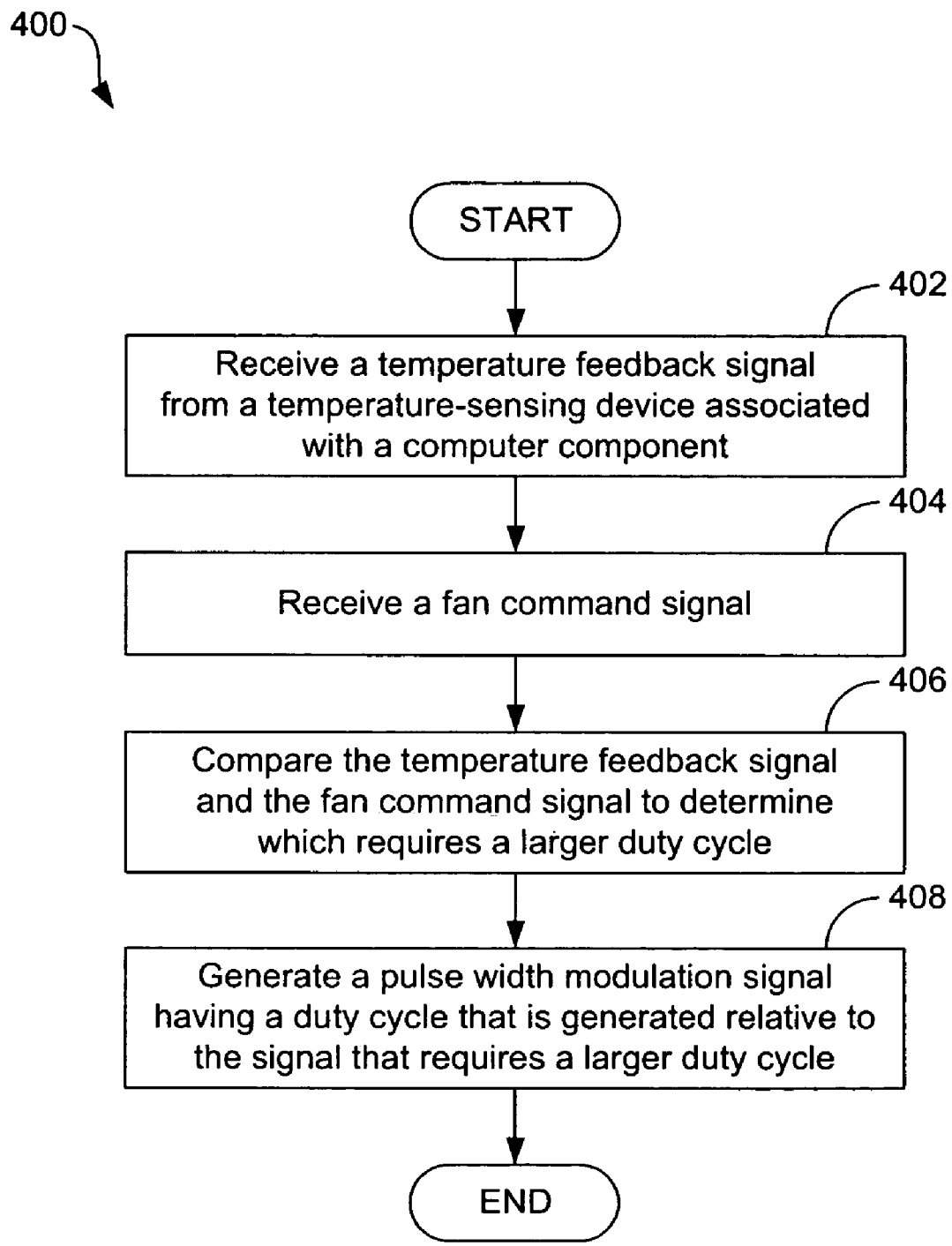
FIG. 4 is a flow chart of an embodiment of a method for controlling a fan.

In view of the foregoing, a method 400 for controlling a fan may be described as indicated in FIG. 4. That method comprises receiving a temperature feedback signal from a temperature-sensing device associated with a computer component (402), receiving a fan command signal (404), comparing the temperature feedback signal and the fan command signal to determine which pertains to a larger duty cycle (406), and generating a pulse width modulation signal having a duty cycle that is generated relative to the signal that pertains to a larger duty cycle (408).

What is claimed is:

1. A fan control system, comprising:
a temperature-sensing device that is adapted to sense a temperature of a particular component that generates heat to be dissipated and output a temperature feedback signal; and
a pulse width modulation control circuit that is configured to receive the temperature feedback signal output from the temperature-sensing device and a separate fan command signal that is generated independent of a sensed component temperature and, relative to those signals, generate a pulse width modulation signal that is sent to a pulse width modulation controlled fan, such that the control circuit can increase the fan speed beyond that mandated by the temperature-sensing device to provide additional cooling to a computer system even though such additional cooling is not required by the component whose temperature the temperature-sensing device measures.

2. The system of claim 1, wherein the temperature-sensing device comprises a thermistor.

3. The system of claim 1, wherein the pulse width modulation control circuit is configured to compare the temperature feedback signal and the fan command signal to determine which corresponds to a larger duty cycle.

4. The system of claim 3, wherein the pulse width modulation control circuit is further configured to generate the pulse width modulation signal such that it has the larger duty cycle.

5. The system of claim 1, wherein the pulse width modulation control circuit is configured to compare the temperature feedback signal and the fan command signal to a ramp signal generated by the pulse width modulation control circuit.

6. The system of claim 5, wherein the ramp signal is generated by an oscillator of the pulse width modulation control circuit.

7. The system of claim 1, wherein the pulse width modulation control circuit comprises a TL594 control chip.

8. The system of claim 1, further comprising a scaling circuit that scales the temperature feedback signal before it is input into the pulse width modulation control circuit.

9. The system of claim 1, further comprising a command signal circuit that converts the fan command signal from a pulse width modulation signal into a DC voltage signal.

10. A fan control system, comprising:
a resistive thermistor that is adapted to be mounted to a particular computer component that is to be cooled by a fan, the thermistor being configured to sense a temperature of the component and output a DC voltage temperature feedback signal; and
a control chip that is configured to receive multiple DC voltage signals and output a pulse width modulation control signal to the fan, the chip having a plurality of pins including a feedback pin and a dead time control pin, the feedback pin receiving the temperature feedback signal output from the thermistor and the dead time control pin receiving a separate fan command signal that is generated independent of a sensed component temperature and output from a motherboard of a computer in which the component and fan are provided, the control chip further being configured to generate a pulse width modulation signal that is sent to the fan, the pulse width modulation signal being generated by comparing the temperature feedback signal and the fan command signal and setting the duty cycle of the pulse width modulation signal to correspond to the larger of the temperature feedback signal and the fan command signal, such that the chip can increase the fan speed beyond that mandated by the thermistor to provide additional cooling to the computer even though such additional cooling is not required by the component whose temperature the thermistor measures.

11. The system of claim 10, wherein the control chip is configured to compare the temperature feedback signal and the fan command signal to a ramp signal generated an oscillator of the control chip.

12. The system of claim 10, wherein the control chip is a TL594 control chip.

13. The system of claim 10, further comprising a scaling circuit that scales the temperature feedback signal before it is input into the control chip.

14. The system of claim 10, further comprising a command signal circuit that converts the fan command signal from a pulse width modulation signal into a DC voltage signal.

15. A fan control system, comprising:
means for outputting a temperature feedback signal reflective of a directly sensed temperature of a particular computer component that generates heat to be dissipated;
means for generating a fan command signal independent of a sensed component temperature; and
control means for receiving the temperature feedback signal and the fan command signal and for generating a pulse width modulation control signal for a fan that cools the computer component, the control means being configured to set a duty cycle of the pulse width modulation control signal relative whichever of the temperature feedback signal and the fan command signal that corresponds to a larger duty cycle, such that the control means can increase the fan speed beyond that mandated by the means for outputting a temperature feedback signal to provide additional cooling to a computer system even though such additional cooling is not required by the component whose temperature is measured.

16. The system of claim 15, wherein the control means comprises a control circuit that is configured to generate the pulse width modulation signal by comparing each of the temperature feedback signal and the fan command signal with a ramp signal generated by the control circuit.

17. The system of claim 15, wherein the control circuit comprises a TL594 control chip.

18. The system of claim 15, further comprising means for scaling the temperature feedback signal.

19. The system of claim 15, further comprising means for converting the fan command signal from a pulse width modulation signal into a DC voltage signal.

20. A computer, comprising:
a motherboard that generates command signals independent of a sensed component temperature;
a component that generates heat to be dissipated;

a temperature-sensing device that directly senses the temperature of the component;

a pulse width modulation controlled fan that cools the component; and a fan control system including a control circuit that is configured to receive a temperature feedback signal output from the temperature-sensing device and a fan command signal output from the motherboard, the control circuit further being configured to generate a pulse width modulation signal that is sent to the fan, the pulse width modulation signal being generated by comparing the temperature feedback signal and the fan command signal and setting a duty cycle of the pulse width modulation signal to be equal to a duty cycle that is equal to the larger of a duty cycle that corresponds to the temperature feedback signal and a duty cycle that corresponds to the fan command signal, such that the control circuit can increase the fan speed beyond that mandated by the temperature-sensing device to provide additional cooling to the computer even though such additional cooling is not required by the component whose temperature the is directly measured.

21. The computer of claim 20, wherein the control circuit is configured to compare the temperature feedback signal and the fan command signal to a ramp signal generated an oscillator of the control chip.

22. The computer of claim 20, wherein the control circuit comprises a TL594 control chip.

23. The computer of claim 20, wherein the control system further comprises a scaling circuit that scales the temperature feedback signal.

24. The computer of claim 20, wherein the control system further comprises a command signal circuit that converts the fan command signal from a pulse width modulation signal into a DC voltage signal.

25. A method for controlling a fan, comprising:

receiving a temperature feedback signal from a temperature-sensing device that measures heat generated by a particular computer component that is to be dissipated;

receiving a fan command signal generated independent of a sensed component temperature;

comparing the temperature feedback signal and the fan command signal to determine which requires a larger duty cycle; and generating a pulse width modulation signal having a duty cycle that is generated relative to the signal that requires a larger duty cycle;

wherein the temperature feedback signal establishes a minimum fan speed and the fan command signal can override the temperature feedback signal to provide additional cooling to a computer system even though such additional cooling is not required by the computer component whose temperature is measured.

26. The method of claim 25, wherein comparing comprises comparing the temperature feedback signal and the fan command signal to a ramp signal generated by an oscillator.

27. The method of claim 25, further comprising scaling the temperature feedback signal.

28. The method of claim 25, further comprising converting a pulse width modulation signal into the DC voltage fan command signal.

29. The system of claim 1, wherein the temperature-sensing device is provided on or within the particular component.

30. The system of claim 10, wherein the resistive thermistor is provided on or within the particular computer component.

31. The system of claim 15, wherein the means for outputting a temperature feedback signal is provided on or within the particular computer component.

32. The system of claim 20, wherein the temperature-sensing device is provided on or within the component.

33. The system of claim 25, wherein the temperature-sensing device is provided on or within the particular computer component.

34. The system of claim 1, wherein the particular component is a power supply of the computer system.

35. The system of claim 10, wherein the particular computer component is a power supply.

36. The system of claim 15, wherein the particular computer component is a power supply.

37. The system of claim 20, wherein the component is a power supply of the computer.

38. The system of claim 25, wherein the particular computer component is a power supply.

* * * * *

UNITED STATES PATENT AND TRADEMARK OFFICE
CERTIFICATE OF CORRECTION

PATENT NO. : 7,211,977 B2  Page 1 of 1
APPLICATION NO. : 10/890308
DATED : May 1, 2007
INVENTOR(S) : George Farris Squibb It is certified that error appears in the above-identified patent and that said Letters Patent is hereby corrected as shown below:

In column 4, line 29, delete "esistance" and insert -- resistance --, therefor.

Signed and Sealed this

Nineteenth Day of August, 2008

JON W. DUDAS
*Director of the United States Patent and Trademark Office*